United States Patent
Yun et al.

(10) Patent No.: US 9,666,810 B2
(45) Date of Patent: May 30, 2017

(54) ORGANIC PHOTOELECTRIC DEVICE, AND IMAGE SENSOR AND ELECTRONIC DEVICE INCLUDING THE SAME

(71) Applicant: Samsung Electronics Co., Ltd., Suwon-si, Gyeonggi-do (KR)

(72) Inventors: Sung Young Yun, Suwon-si (KR); Gae Hwang Lee, Seongnam-si (KR); Kwang Hee Lee, Yongin-si (KR); Dong-Seok Leem, Hwaseong-si (KR); Yong Wan Jin, Seoul (KR); Tadao Yagi, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/682,534

(22) Filed: Apr. 9, 2015

(65) Prior Publication Data

US 2016/0111651 A1   Apr. 21, 2016

(30) Foreign Application Priority Data

Oct. 21, 2014   (KR) .................. 10-2014-0142652

(51) Int. Cl.
*H01L 51/00* (2006.01)
*H01L 27/30* (2006.01)
*H01L 51/42* (2006.01)

(52) U.S. Cl.
CPC ........ *H01L 51/0061* (2013.01); *H01L 27/307* (2013.01); *H01L 51/4253* (2013.01); *H01L 51/4293* (2013.01); *H01L 51/006* (2013.01); *H01L 51/008* (2013.01); *H01L 51/0046* (2013.01); *H01L 51/0053* (2013.01); *H01L 51/0058* (2013.01); *H01L 51/0068* (2013.01); *H01L 2251/308* (2013.01); *Y02E 10/549* (2013.01)

(58) Field of Classification Search
CPC ...... H01L 21/0032; H01L 51/44; H01L 51/42
See application file for complete search history.

(56) References Cited

U.S. PATENT DOCUMENTS

| | | | |
|---|---|---|---|
| 7,884,355 B2 | 2/2011 | Chua et al. | |
| 8,525,577 B2 * | 9/2013 | Yofu ...................... | B82Y 10/00 257/40 |
| 9,085,537 B2 * | 7/2015 | Nomura ............... | C07D 209/86 |
| 2005/0110007 A1 | 5/2005 | Forrest et al. | |
| 2011/0034972 A1 | 2/2011 | Samuel et al. | |

FOREIGN PATENT DOCUMENTS

| | | |
|---|---|---|
| JP | 2008-166539 A | 7/2008 |
| KR | 2006-0030025 A | 4/2006 |

* cited by examiner

*Primary Examiner* — Yu-Hsi D Sun
(74) *Attorney, Agent, or Firm* — Harness, Dickey & Pierce, P.L.C.

(57) ABSTRACT

An organic photoelectric device includes a first electrode and a second electrode facing each other and a photoelectric conversion layer between the first electrode and the second electrode, wherein the photoelectric conversion layer includes a p-type semiconductor compound and an n-type semiconductor compound, and the organic photoelectric device satisfies Equation 1, and has external quantum efficiency (EQE) of greater than or equal to about 40% at −3 V.

18 Claims, 12 Drawing Sheets

ORGANIC PHOTOELECTRIC DEVICE, AND IMAGE SENSOR AND ELECTRONIC DEVICE INCLUDING THE SAME

RELATED APPLICATIONS

This application claims the benefit of priority from Korean Patent Application No. 10-2014-0142652 filed in the Korean Intellectual Property Office on Oct. 21, 2014, the entire contents of which are incorporated herein by reference.

BACKGROUND

1. Field

Example embodiments relate to an organic photoelectric device and an image sensor and/or an electronic device including the same.

2. Description of the Related Art

A photoelectric device converts light into an electrical signal using photoelectric effects, may include a photodiode, a phototransistor, and the like, and may be applied to an image sensor, and the like.

An image sensor including a photodiode requires typically high resolution and thus a small pixel. At present, a silicon photodiode is widely used, but presents a disadvantage of deteriorated sensitivity for having a small absorption area due to small pixels. Accordingly, an organic material that is capable of replacing silicon is being researched.

Organic materials typically have a high extinction coefficient and selectively absorb light in a particular wavelength region depending on a molecular structure, and thus may simultaneously replace a photodiode and a color filter and resultantly improve sensitivity and contribute to high integration.

SUMMARY

When an image sensor receives light, charges produced therein are accumulated as floating diffusion capacitance between electrodes, and a voltage applied thereto is changed. The applied voltage changes external quantum efficiency (EQE), and thus, a linear relationship between the number of photons radiated into the image sensor and the accumulated charges is broken.

An example embodiment relates to an organic photoelectric device including a photoelectric conversion layer for maintaining the linear relationship.

Another example embodiment relates to an image sensor including the organic photoelectric device and an electronic device.

According to an example embodiment, an organic photoelectric device includes a first electrode and a second electrode facing each other, and a photoelectric conversion layer between the first electrode and the second electrode, wherein the photoelectric conversion layer includes a p-type semiconductor compound and an n-type semiconductor compound, and the organic photoelectric device satisfies the following Equation 1 and has an external quantum efficiency (EQE) that is greater than or equal to about 40% at −3 V.

$$\frac{|(EQE \text{ at } -3V)(EQE \text{ at } -2V)|}{(EQE \text{ at } -3V)} \leq 0.1$$ [Equation 1]

In Equation 1,
"EQE at −3 V" and "EQE at −2 V" represent the EQE at −3 V and at −2 V, respectively.

According to at least one example embodiment, the p-type semiconductor compound may be or include an indandione-based compound and the n-type semiconductor compound may be or include fullerene or a fullerene derivative.

The indandione-based compound may be represented by the following Chemical Formula 1.

[Chemical Formula 1]

In Chemical Formula 1,
$Ar^1$ and $Ar^2$ are independently a phenyl group or a naphthyl group, provided that at least one of $Ar^1$ and $Ar^2$ is a naphthyl group, $R^1$ to $R^4$ are independently hydrogen, a C1 to C6 alkyl group, a C1 to C6 haloalkyl group, a halogen, or CN, n is 0 or 1, and m is an integer ranging from 1 to 3.

The compound has 6 or 7 aromatic rings.

The p-type semiconductor compound may be represented by the following Chemical Formula 1-1.

[Chemical Formula 1-1]

In Chemical Formula 1-1,
$R^1$ to $R^4$ are independently hydrogen, a C1 to C6 alkyl group, a C1 to C6 haloalkyl group, a halogen, or CN, $R^a$ to $R^c$ are independently hydrogen, a C1 to C6 alkyl group, a C1 to C6 haloalkyl group, a halogen, or CN, p, q, and r are integers ranging from 1 to 3, and m is an integer ranging from 1 to 3.

The p-type semiconductor compound may be represented by the following Chemical Formula 1-2.

[Chemical Formula 1-2]

In Chemical Formula 1-2,
$R^1$ to $R^4$ are independently hydrogen, a C1 to C6 alkyl group, a C1 to C6 haloalkyl group, a halogen, or CN, $R^a$ to $R^d$ are independently hydrogen, a C1 to C6 alkyl group, a C1 to C6 haloalkyl group, a halogen, or CN, p, q, r, and s are integers ranging from 1 to 3, and
m is an integer ranging from 1 to 3.

The p-type semiconductor compound may be represented by the following Chemical Formula 1-3.

[Chemical Formula 1-3]

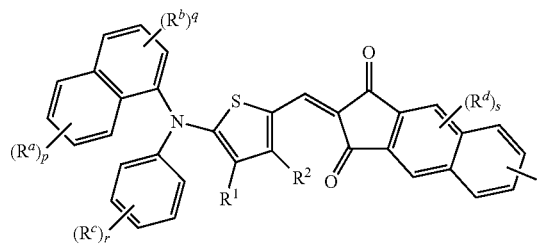

In Chemical Formula 1-3, $R^1$ to $R^4$ are independently hydrogen, a C1 to C6 alkyl group, a C1 to C6 haloalkyl group, a halogen, or CN, $R^a$ to $R^c$ are independently hydrogen, a C1 to C6 alkyl group, a C1 to C6 haloalkyl group, a halogen, or CN, p, q, and r are integers ranging from 1 to 3, and
m is an integer ranging from 1 to 3.

The p-type semiconductor compound may show a light absorption curve having a full width at half maximum (FWHM) of about 50 nm to about 110 nm in a thin film state.

The p-type semiconductor compound may be or include a compound that selectively absorbs light in a green wavelength region, and may have a maximum absorption wavelength ($\lambda_{max}$) at about 500 nm to about 600 nm.

The fullerene or fullerene derivative may be or include one of C60, a C60 derivative, C70, a C70 derivative, and a combination thereof.

When the volumes of the p-type semiconductor compound and the n-type semiconductor compound are referred to as p and n, respectively, n/p may be in a range of about $0.5 < n/p \leq about\ 2$.

The p-type semiconductor compound may be or include a metal-free phthalocyanine and the n-type semiconductor compound may be or include fullerene or a fullerene derivative.

The metal-free phthalocyanine may be represented by the following Chemical Formula 2.

[Chemical Formula 2]

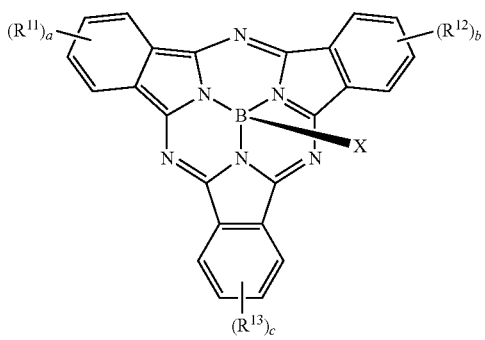

In Chemical Formula 2, $R^{11}$ to $R^{13}$ are independently hydrogen, a substituted or unsubstituted C1 to C30 aliphatic hydrocarbon group, a substituted or unsubstituted C6 to C30 aromatic hydrocarbon group, a substituted or unsubstituted C1 to C30 aliphatic heterocyclic group, a substituted or unsubstituted C2 to C30 aromatic heterocyclic group, a substituted or unsubstituted C1 to C30 alkoxy group, a substituted or unsubstituted C1 to C30 aryloxy group, a thio group, an alkylthio group, an arylthio group, a cyano group, a cyano-containing group, a halogen, a halogen-containing group, a substituted or unsubstituted sulfonyl group, a substituted or unsubstituted aminosulfonyl group, a substituted or unsubstituted arylsulfonyl group, or a combination thereof, a, b, and c are integers ranging from 1 to 3, X is —F, —$OR^{22}$, —$N(R^{23})(R^{24})$, or —$OSi(R^{25})(R^{26})(R^{27})$, $R^{22}$ is a substituted or unsubstituted C6 to C30 aryl group, a substituted or unsubstituted C3 to C30 heteroaryl group, a substituted or unsubstituted silyl group, or a combination thereof, $R^{23}$ and $R^{24}$ are independently a substituted or unsubstituted C6 to C30 aryl group, a substituted or unsubstituted C3 to C30 heteroaryl group, a substituted or unsubstituted silyl group, or a combination thereof, and $R^{25}$, $R^{26}$, and $R^{27}$ are independently a substituted or unsubstituted C1 to C30 alkyl group, a substituted or unsubstituted C6 to C30 aryl group, a substituted or unsubstituted C3 to C30 heterocyclic group, a substituted or unsubstituted C1 to C30 alkoxy group, a substituted or unsubstituted amine group, a substituted or unsubstituted C6 to C30 arylamine group, a substituted or unsubstituted silyl group, or a combination thereof.

The fullerene or the fullerene derivative may be or include one of C60, a C60 derivative, C70, a C70 derivative, and a combination thereof.

When the volumes of the p-type semiconductor compound and the n-type semiconductor compound are referred to as p and n, respectively, n/p may be in a range of about $1 < n/p \leq about\ 3$.

The photoelectric conversion layer may include an intrinsic layer including the p-type semiconductor compound and the n-type semiconductor compound.

The photoelectric conversion layer may further include at least one of a p-type layer on one side of the intrinsic layer and an n-type layer on the other side of the intrinsic layer.

According to another example embodiment, an image sensor including the organic photoelectric device is provided.

The image sensor may include a semiconductor substrate integrated with a plurality of first photo-sensing devices sensing light in a blue wavelength region and a plurality of second photo-sensing devices sensing light in a red wavelength region, a color filter layer positioned on the semiconductor substrate and including a blue filter selectively absorbing light in a blue wavelength region and a red filter selectively absorbing light in a red wavelength region, and the organic photoelectric device positioned on the color filter layer and selectively absorbing light in a green wavelength region.

According to another example embodiment, an electronic device including the image sensor is provided.

DETAILED DESCRIPTION

Figure 1:
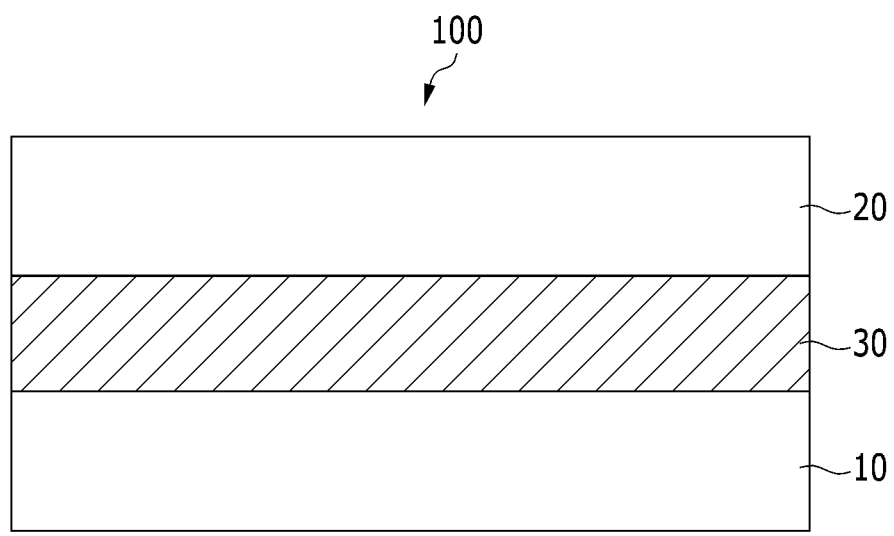
FIG. 1 is a cross-sectional view showing an organic photoelectric device according to at least one example embodiment.

Example embodiments will hereinafter be described in detail, and may be easily performed by those who have common knowledge in the related art. However, this disclosure may be embodied in many different forms and is not construed as limited to the example embodiments set forth herein.

It will be understood that when an element is referred to as being "on," "connected" or "coupled" to another element, it can be directly on, connected or coupled to the other element or intervening elements may be present. In contrast, when an element is referred to as being "directly on," "directly connected" or "directly coupled" to another element, there are no intervening elements present. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. Also, the dimensions of layers and regions may be exaggerated for clarity of illustration. Like reference numerals refer to like elements throughout. The same reference numbers indicate the same components throughout the specification.

In the drawings, parts having no relationship with the description are omitted for clarity of the embodiments, and the same or similar constituent elements are indicated by the same reference numerals throughout the specification.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, expressions such as "at least one of," when preceding a list of elements, modify the entire list of elements and do not modify the individual elements of the list.

As used herein, when a definition is not otherwise provided, the term "substituted" refers to one substituted with a substituent with a halogen atom (F, Br, Cl, or I), a hydroxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid or a salt thereof, a C1 to C20 alkyl group, a C1 to C20 alkoxy group, a C2 to C20 alkenyl group, a C2 to C20 alkynyl group, a C6 to C30 aryl group, a C7 to C30 arylalkyl group, a C1 to C20 alkoxy group, a C1 to C20 heteroalkyl group, C3 to C20 heteroarylalkyl group, a C3 to C30 cycloalkyl group, a C3 to C15 cycloalkenyl group, a C6 to C15 cycloalkynyl group, a C2 to C20 heterocycloalkyl group, and a combination thereof, instead of hydrogen of a compound.

As used herein, when a definition is not otherwise provided, the term "hetero" refers to one including 1 to 3 heteroatoms selected from N, O, S, and P.

Hereinafter, an organic photoelectric device according to at least one example embodiment is described with reference to the drawings.

FIG. 1 is a cross-sectional view showing an organic photoelectric device according to at least one example embodiment.

Referring to FIG. 1, an organic photoelectric device 100 according to at least one example embodiment includes a first electrode 10 and a second electrode 20 facing each other, and a photoelectric conversion layer 30 between the first electrode 10 and the second electrode 20.

One of the first electrode 10 and the second electrode 20 may be an anode and the other may be a cathode. At least one of the first electrode 10 and the second electrode 20 may be a light-transmitting electrode, and the light-transmitting electrode may be made of or include, for example, a transparent conductor such as indium tin oxide (ITO) or indium zinc oxide (IZO), or may be or include a single layered or a multiple layered thin metal film having a thin thickness. One of the first electrode 10 and the second electrode 20 may be or include a non-light-transmitting electrode made of, for example, an opaque conductor such as aluminum (Al).

The photoelectric conversion layer 30 may include a p-type semiconductor compound and an n-type semiconductor compound to form a pn junction, which is a layer producing excitons by receiving light from the outside and then separating holes and electrons from the produced excitons.

The organic photoelectric device satisfies the following Equation 1, and has an external quantum efficiency (EQE) that is greater than or equal to about 40 at −3 V.

$$\frac{|(EQE \text{ at } -3V)(EQE \text{ at } -2V)|}{EQE \text{ at } -3V} \leq 0.1 \quad \text{[Equation 1]}$$

In Equation 1
"EQE at −3V" and "EQE at −2V" represent the EQE at −3 V and −2 V, respectively.

As shown in the Equation 1, the organic photoelectric device may have a difference between the external quantum efficiency at −3 V and the external quantum efficiency at −2 V of less than or equal to about 0.1 (less than or equal to about 10% as a percentage), and specifically, less than or equal to about 0.09 (9%). In other words, the external quantum efficiency from −3 V to −2 V maintains linearity but decreases with a slope of less than or equal to about 0.1.

When the external quantum efficiency difference at −3 V and −2 V is less than or equal to about 0.1 (less than or equal to about 10% as a percentage), linearity between light intensity and accumulated charges may be ensured, and thus the efficiency of an organic photoelectric device depending on an applied voltage may be constantly maintained.

The p-type semiconductor compound of the photoelectric conversion layer 30 may be or include an indandione-based compound. The indandione-based compound may be represented by the following Chemical Formula 1.

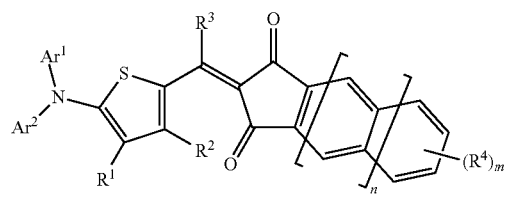

[Chemical Formula 1]

In Chemical Formula 1,
$Ar^1$ and $Ar^2$ are independently a phenyl group or a naphthyl group, provided that at least one of $Ar^1$ and $Ar^2$ is a naphthyl group,
$R^1$ to $R^4$ are independently hydrogen, a C1 to C6 alkyl group, a C1 to C6 haloalkyl group, a halogen, or CN,
n is 0 or 1, and
m is an integer ranging from 1 to 3.
The compound may have 6 to 7 aromatic rings.
In Chemical Formula 1, when m is greater than or equal to 2, each $R^4$ may be different from each other.
In Chemical Formula 1, when n is 0, one of $Ar^1$ and $Ar^2$ may be or include a naphthyl group and the other may be or include a phenyl group, and the nitrogen (N) may be bonded at the 1-position of the naphthyl group. The p-type semiconductor compound may be represented by the following Chemical Formula 1-1.

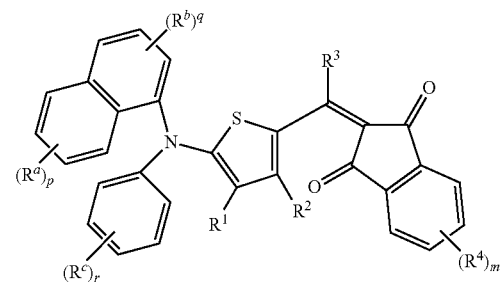

[Chemical Formula 1-1]

In Chemical Formula 1-1,
$R^1$ to $R^4$ are independently hydrogen, a C1 to C6 alkyl group, a C1 to C6 haloalkyl group, a halogen, or CN,
$R^a$ to $R^c$ are independently hydrogen, a C1 to C6 alkyl group, a C1 to C6 haloalkyl group, a halogen, or CN, p, q, and r are integers ranging from 1 to 3, and
m is an integer ranging from 1 to 3.

In Chemical Formula 1-1, when m is greater than or equal to 2, each $R^4$ may be different from each other, and when p, q, and r are greater than or equal to 2, each $R^a$ to $R^c$ may be different from each other.

In Chemical Formula 1, when n is 0, $Ar^1$ and $Ar^2$ may be or include a naphthyl group, and the nitrogen (N) may be bonded at the 2-position of the naphthyl group. The p-type semiconductor compound may be represented by the following Chemical Formula 1-2.

[Chemical Formula 1-2]

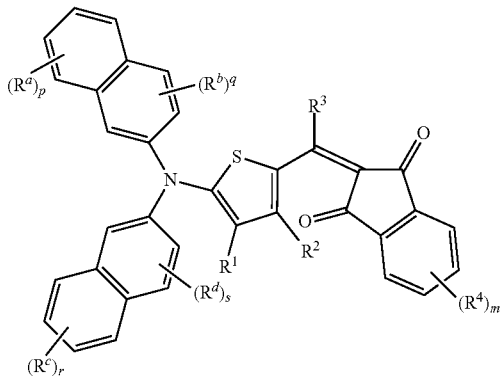

In Chemical Formula 1-2,
$R^1$ to $R^4$ are independently hydrogen, a C1 to C6 alkyl group, a C1 to C6 haloalkyl group, a halogen, or CN,
$R^a$ to $R^d$ are independently hydrogen, a C1 to C6 alkyl group, a C1 to C6 haloalkyl group, a halogen, or CN,
p, q, r, and s are integers ranging from 1 to 3, and
m is an integer ranging from 1 to 3.

In Chemical Formula 1-2, when m is greater than or equal to 2, each $R^4$ may be different from each other, and when p, q, r, and s are greater than or equal to 2, each $R^a$ to $R^d$ may be different from each other.

In Chemical Formula 1, when n is 1, one of $Ar^1$ and $Ar^2$ may be or include a naphthyl group and the other may be or include a phenyl group, and the nitrogen (N) may be bonded at the 1-position of the naphthyl group. The p-type semiconductor compound may be represented by the following Chemical Formula 1-3.

[Chemical Formula 1-3]

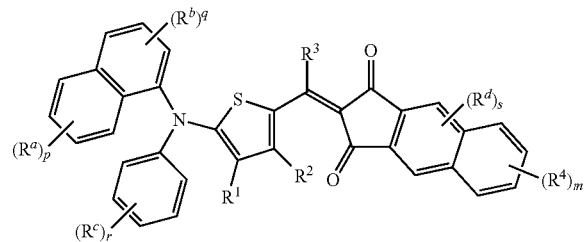

In Chemical Formula 1-3,
$R^1$ to $R^4$ are independently hydrogen, a C1 to C6 alkyl group, a C1 to C6 haloalkyl group, a halogen, or CN,
$R^a$ to $R^c$ are independently hydrogen, a C1 to C6 alkyl group, a C1 to C6 haloalkyl group, a halogen, or CN,
p, q, and r are integers ranging from 1 to 3, and
m is an integer ranging from 1 to 3.

In Chemical Formula 1-3, when m is greater than or equal to 2, each $R^4$ may be different from each other, and when p, q, and r are greater than or equal to 2, each $R^a$ to $R^c$ may be different from each other.

The halogen refers to F, Cl, Br, or I, and the haloalkyl group refers to an alkyl group where at least one hydrogen is substituted with F, Cl, Br, or I. Specific examples of the haloalkyl group may be or include a fluoroalkyl group, for example a perfluoroalkyl group.

In the p-type semiconductor compound, 6 or 7 aromatic rings forming a conjugation structure may be present throughout the compound. When there are 6 or fewer aromatic rings, a full width at half maximum (FWHM) in the light absorption curved line of the compound is so wide that selective absorption of green light is deteriorated, while when there are 7 or more aromatic rings, a maximum absorption wavelength moves toward red, and thus selective absorption of green light may be deteriorated.

In addition, the p-type semiconductor compound has a structure in which at least one of $Ar^1$ and $Ar^2$ as a substituent bonded with N in Chemical Formula 1 is necessarily a naphthyl group. When the $Ar^1$ and $Ar^2$ are not aromatic groups but are alkyl groups fused together and form an N-containing ring, or are phenyl groups, the compound has a plane structure, and thus a full width at half maximum (FWHM) in the light absorption curve becomes too wide.

The p-type semiconductor compound may show a light absorption curve having a relatively smaller full width at half maximum (FWHM) of about 50 nm to about 110 nm, specifically about 50 nm to about 100 nm, and more specifically about 50 nm to about 90 nm, in a thin film state. Herein, the FWHM is a width of a wavelength corresponding to a half of a maximum absorption point. A smaller FWHM indicates selective absorption of light in a narrow wavelength region and high wavelength selectivity. Accordingly, a compound having a FWHM within the range may have high selectivity for a green wavelength region. The thin film may be a deposited thin film under a vacuum condition.

The p-type semiconductor compound may be or include a compound that selectively absorbs light in a green wavelength region, and may have a maximum absorption wavelength ($\lambda_{max}$) at about 500 nm to about 600 nm, and specifically about 520 nm to about 590 nm.

The p-type semiconductor compound may have a HOMO level of about 5.2 eV to about 5.5 eV, and an energy bandgap of about 1.9 eV to about 2.3 eV. When the compound has the HOMO level and energy bandgap within the range, the compound may be applied as a semiconductor effectively absorbing light in a green wavelength region, and thus may have a high external quantum efficiency (EQE) to improve photoelectric conversion efficiency.

The p-type semiconductor compound may have a molecular weight of about 300 to about 1500, more specifically about 350 to about 1,200, and still more specifically about 400 to about 900. When the p-type semiconductor compound has a molecular weight within the range, the crystallinity of the p-type semiconductor compound may be inhibited, and thermal decomposition during formation of a thin film by deposition may be substantially prevented or reduced.

The p-type semiconductor compound may have a melting point that is greater than or equal to about 200° C., for example, greater than or equal to 250° C., or greater than or equal to about 280° C. When the p-type semiconductor compound has a melting point within any one of the above ranges, a coating layer may be stably deposited, and a decomposed product may be decreased, providing an organic photoelectric device having improved photoelectric conversion performance.

The n-type semiconductor compound of the photoelectric conversion layer 30 may be or include fullerene or a fullerene derivative.

The fullerene or fullerene derivative may be or include one of C60, a C60 derivative, C70, a C70 derivative, and a combination thereof.

In an example embodiment, the volumes of the p-type semiconductor compound and the n-type semiconductor compound are referred to as p and n, respectively, and n/p may be in ranges of about 0.5<n/p≤about 2, about 0.7≤n/p≤about 1.8, or about 0.7≤n/p≤about 1.2. When the volumes of the p-type and n-type semiconductor compounds are maintained within any one of the above ranges, external quantum efficiency for maintaining a linear relation between an applied voltage and external quantum efficiency (EQE) may be obtained.

In another example embodiment, the p-type semiconductor compound of the photoelectric conversion layer 30 may be or include a metal-free phthalocyanine.

The metal-free phthalocyanine may be represented by the following Chemical Formula 2.

[Chemical Formula 2]

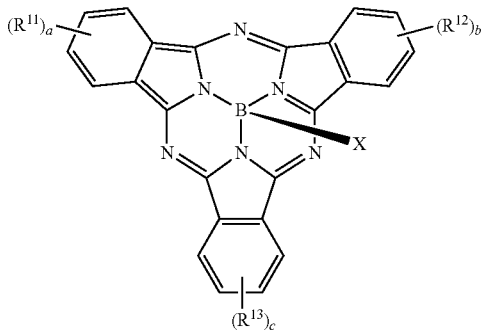

In Chemical Formula 2, $R^{11}$ to $R^{13}$ are independently hydrogen, a substituted or unsubstituted C1 to C30 aliphatic hydrocarbon group, a substituted or unsubstituted C6 to C30 aromatic hydrocarbon group, a substituted or unsubstituted C1 to C30 aliphatic heterocyclic group, a substituted or unsubstituted C2 to C30 aromatic heterocyclic group, a substituted or unsubstituted C1 to C30 alkoxy group, a substituted or unsubstituted C1 to C30 aryloxy group, a thio group, an alkylthio group, an arylthio group, a cyano group, a cyano-containing group, a halogen, a halogen-containing group, a substituted or unsubstituted sulfonyl group, a substituted or unsubstituted aminosulfonyl group, a substituted or unsubstituted arylsulfonyl group, or a combination thereof, a, b, and c are integers ranging from 1 to 3, X is —F, —$OR^{22}$, —$N(R^{23})(R^{24})$, or —$OSi(R^{25})(R^{26})(R^{27})$, $R^{22}$ is a substituted or unsubstituted C6 to C30 aryl group, a substituted or unsubstituted C3 to C30 heteroaryl group, a substituted or unsubstituted silyl group, or a combination thereof, $R^{23}$ and $R^{24}$ are independently a substituted or unsubstituted C6 to C30 aryl group, a substituted or unsubstituted C3 to C30 heteroaryl group, a substituted or unsubstituted silyl group, or a combination thereof, and $R^{25}$, $R^{26}$, and $R^{27}$ are independently a substituted or unsubstituted C1 to C30 alkyl group, a substituted or unsubstituted C6 to C30 aryl group, a substituted or unsubstituted C3 to C30 heterocyclic group, a substituted or unsubstituted C1 to C30 alkoxy group, a substituted or unsubstituted amine group, a substituted or unsubstituted C6 to C30 arylamine group, a substituted or unsubstituted silyl group, or a combination thereof.

The p-type semiconductor compound may have a molecular weight that is greater than or equal to about 500. Within this range, the p-type semiconductor compound may have, for example, a molecular weight of about 500 to about 1200, or about 500 to about 800. When the p-type semiconductor compound has a molecular weight within any one of the above ranges, the crystallinity of the p-type semiconductor compound may be inhibited and thermal decomposition during formation of a thin film by deposition may be substantially prevented or reduced.

The n-type semiconductor compound of the photoelectric conversion layer 30 may be or include fullerene or a fullerene derivative.

The fullerene or the fullerene derivative may be or include one of C60, a C60 derivative, C70, a C70 derivative, and a combination thereof.

In an example embodiment, when the volumes of the p-type semiconductor compound and the n-type semiconductor compound are referred to as p and n, respectively, n/p may be in a range of about 1<n/p≤about 3, about 1.5≤n/p≤about 3, or about 2≤n/p≤about 3. When the volumes of the p-type and n-type semiconductor compounds are maintained within any one of the above ranges, an external quantum efficiency for maintaining a linear relation between the applied voltage and external quantum efficiency (EQE) may be obtained.

The photoelectric conversion layer 30 may be or include a single layer or a multilayer. The photoelectric conversion layer 30 may be, for example, an intrinsic layer (I layer), p-type layer/I layer, I layer/n-type layer, p-type layer/I layer/n-type layer, p-type layer/n-type layer, and the like.

The photoelectric conversion layer 30 may include an intrinsic layer formed by codepositing the p-type semiconductor compound and the n-type semiconductor compound in a desired, or alternatively predetermined ratio. Herein, at least one of a p-type layer positioned on one side of the intrinsic layer and an n-type layer positioned on the other side of the intrinsic layer may be further included therein.

In addition, when the photoelectric conversion layer 30 includes the p-type layer including the p-type semiconductor compound and the n-type layer including the n-type semiconductor compound, each p-type and n-type layer may be formed to obtain the ratio between the p-type and n-type semiconductor compounds.

The intrinsic layer (I layer) may have a thickness of about 50 nm to about 200 nm, or of about 80 nm to about 150 nm. When the thickness of the intrinsic layer is within any one of the above ranges, the intrinsic layer (a photoelectric conversion layer) constantly maintaining external quantum efficiency (EQE) regardless of an applied voltage may be easily designed.

The photoelectric conversion layer 30 may have a thickness of about 50 nm to about 500 nm, or of about 5 nm to about 300 nm. Within this thickness range, the photoelectric conversion layer 30 may more effectively absorb light, more effectively separate holes from electrons and transport the holes and/or the electrons, thereby effectively improving photoelectronic conversion efficiency. An optimal thickness of a thin film may be, for example, determined by an absorption coefficient of the photoelectric conversion layer 30, and may be, for example, a thickness being capable of absorbing light of at least about 70% or more, for example about 80% or more, and for another example about 90% or more.

In the organic photoelectric device 100, when light enters from the first electrode 10 and/or from the second electrode 20, and when the photoelectric conversion layer 30 absorbs light having a desired, or alternatively predetermined wavelength region, excitons may be produced from the inside. The excitons are separated into holes and electrons in the photoelectric conversion layer 30, and the separated holes are transported to an anode that is one of the first electrode 10 and second electrode 20, while the separated electrons are transported to the cathode that is the other one of the first electrode 10 and second electrode 20 so as to flow a current in the organic photoelectric device.

Hereinafter, an organic photoelectric device according to another example embodiment is described referring to FIG. 2.

Figure 2:
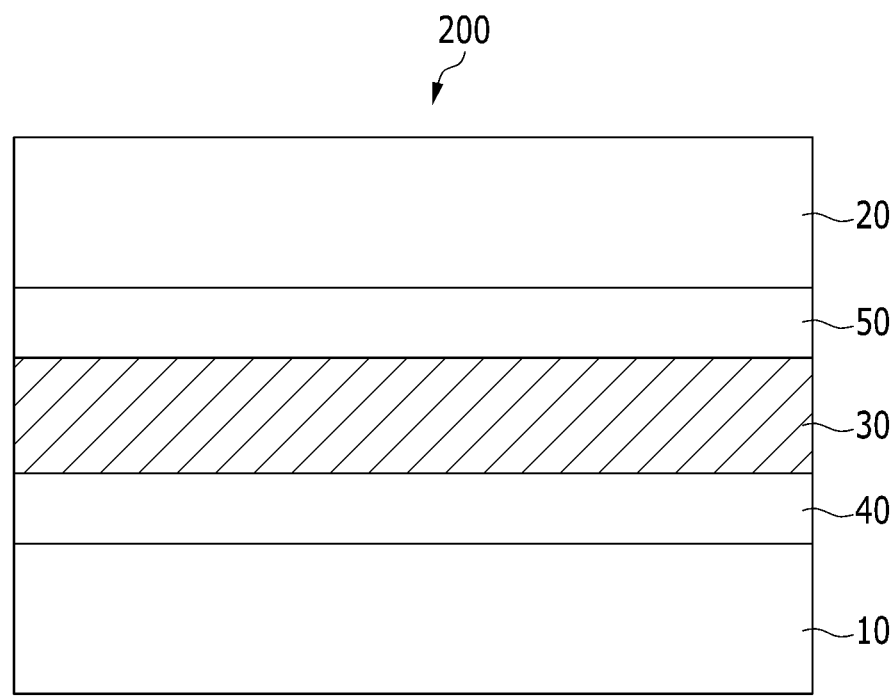
FIG. 2 is a cross-sectional view showing an organic photoelectric device according to at least one example embodiment.

FIG. 2 is a cross-sectional view showing an organic photoelectric device according to another example embodiment.

Referring to FIG. 2, an organic photoelectric device 200 according to at least one example embodiment includes a first electrode 10 and a second electrode 20 facing each other, and a photoelectric conversion layer 30 between the first electrode 10 and the second electrode 20.

The organic photoelectric device 200 according to the example embodiment further includes auxiliary charge layers 40 and 50 between the first electrode 10 and the photoelectric conversion layer 30, and between the second electrode 20 and the photoelectric conversion layer 30, respectively. The auxiliary charge layers 40 and 50 may facilitate the transfer of holes and electrons separated from the photoelectric conversion layer 30, so as to increase efficiency.

The auxiliary charge layers 40 and 50 may be or include at least one of a hole injection layer (HIL) configured to facilitate hole injection, a hole transport layer (HTL) configured to facilitate hole transport, an electron blocking layer (EBL) configured to substantially prevent or reduce electron transport, an electron injection layer (EIL) configured to facilitate electron injection, an electron transport layer (ETL) configured to facilitate electron transport, and a hole blocking layer (HBL) configured to substantially prevent or reduce hole transport.

The auxiliary charge layers 40 and 50 may include, for example, an organic material, an inorganic material, or an organic/inorganic material. The organic material may be or include an organic compound having hole or electron characteristics, and the inorganic material may be or include, for example, a metal oxide such as molybdenum oxide, tungsten oxide, nickel oxide, and the like.

The hole transport layer (HTL) may include one of, for example, poly(3,4-ethylenedioxythiophene):poly(styrenesulfonate) (PEDOT:PSS), polyarylamine, poly(N-vinylcarbazole), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), m-MTDATA, 4,4',4"-tris (N-carbazolyl)-triphenylamine (TCTA), and a combination thereof, but is not limited thereto.

The electron blocking layer (EBL) may include one of, for example, poly(3,4-ethylenedioxythiophene):poly(styrenesulfonate) (PEDOT:PSS), polyarylamine, poly(N-vinylcarbazole), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), m-MTDATA, 4,4',4"-tris (N-carbazolyl)-triphenylamine (TCTA), and a combination thereof, but is not limited thereto.

The electron transport layer (ETL) may include one of, for example, 1,4,5,8-naphthalene-tetracarboxylic dianhydride (NTCDA), bathocuproine (BCP), LiF, $Alq_3$, $Gaq_3$, $Inq_3$, $Znq_2$, $Zn(BTZ)_2$, $BeBq_2$, and a combination thereof, but is not limited thereto.

The hole blocking layer (HBL) may include one of, for example, 1,4,5,8-naphthalene-tetracarboxylic dianhydride (NTCDA), bathocuproine (BCP), LiF, $Alq_3$, $Gaq_3$, $Inq_3$, $Znq_2$, $Zn(BTZ)_2$, $BeBq_2$, and a combination thereof, but is not limited thereto.

Either one of the auxiliary charge layers 40 and 50 may be omitted, according to at least one example embodiment.

The organic photoelectric device may be applied to various fields, for example a solar cell, an image sensor, a photo-detector, a photo-sensor, and an organic light emitting diode (OLED), but is not limited thereto.

Hereinafter, an example of an image sensor including the organic photoelectric device is described referring to drawings. As an example of an image sensor, an organic CMOS image sensor is described.

Figure 3:
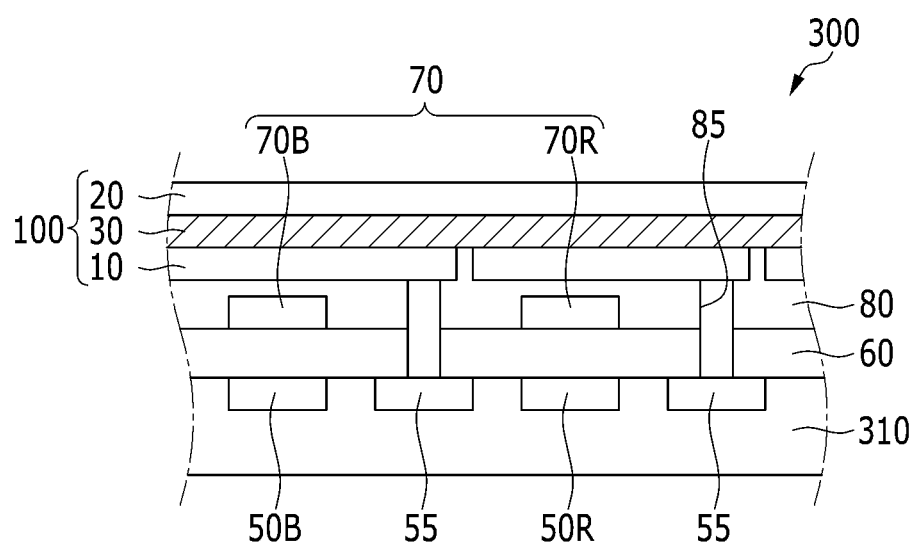
FIG. 3 is a cross-sectional view showing an organic CMOS image sensor according to at least one example embodiment.

FIG. 3 is a cross-sectional view of an organic CMOS image sensor according to at least one example embodiment.

FIG. 3 illustrates a blue pixel, a green pixel, and a red pixel that are adjacent to each other, but this disclosure is not limited thereto.

Referring to FIG. 3, an organic CMOS image sensor 300 according to at least one example embodiment includes a semiconductor substrate 310 integrated with photo-sensing devices 50B and 50R, a transmission transistor (not shown) and a charge storage 55, a lower insulation layer 60, a color filter 70, an upper insulation layer 80, and the organic photoelectric device 100.

The semiconductor substrate 310 may be or include a silicon substrate, and may be integrated with photo-sensing devices 50R and 50B, a transmission transistor (not shown), and the charge storage 55. The photo-sensing devices 50R and 50B may be photodiodes.

The photo-sensing devices 50B and 50R, the transmission transistor, and/or the charge storage 55 may be integrated in each pixel, and for example, as shown in the drawing, the photo-sensing devices 50B and 50R may be included in a blue pixel and a red pixel, and the charge storage 55 may be included in a green pixel.

The photo-sensing devices 50B and 50R sense light, the sensed information may be transferred by the transmission transistor, the charge storage 55 is electrically connected to the organic photoelectric device 100 which will be described later, and the information of the charge storage 55 may be transferred by the transmission transistor.

A metal wire (not shown) and a pad (not shown) are formed on the semiconductor substrate 310. In order to decrease signal delay, the metal wire and pad may be made of or include a metal having low resistivity, for example, aluminum (Al), copper (Cu), silver (Ag), and alloys thereof, but are not limited thereto. However, the metal wire and pad may be under the photo-sensing devices 50B and 50R without being limited to the structure.

The lower insulation layer 60 may be on the metal wire and pad. The lower insulation layer 60 may be made of or include, for example, an inorganic insulation material such as a silicon oxide and/or a silicon nitride, or a low dielectric constant (low K) material such as SiC, SiCOH, SiCO, and SiOF. The lower insulation layer 60 may have a trench exposing the charge storage 55. The trench may be filled with a filler.

The color filter layer 70 may be on the lower insulation layer 60. The color filter layer 70 includes a color filter 70B of a blue pixel and a color filter 70R of a red pixel. In an example embodiment, a green filter is not provided, but a green filter may be provided as needed.

The upper insulation layer 80 may be on the color filter layer 70. The upper insulation layer 80 may be configured to reduce steps caused by the color filter layer 70, and may planarize the color filter layer 70. The upper insulation layer 80 and the lower insulation layer 60 have a contact hole (not shown) exposing the pad, and a through-hole 85 exposing the charge storage 55 of the green pixel.

The organic photoelectric device 100 is on the upper insulation layer 80. The organic photoelectric device 100 includes a first electrode 10, a photoelectric conversion layer 30, and a second electrode 20 as described above.

The first electrode 10 and the second electrode 20 may be transparent electrodes, and the photoelectric conversion layer 30 may be configured to selectively absorb light in a green wavelength region as described above, and may replace a color filter of a green pixel.

Light in a green wavelength region of the incident light from the second electrode 20 is mainly absorbed by the photoelectric conversion layer 30 and photoelectrically converted, and light in other wavelength regions transmits through the first electrode 10 and is sensed by the photo-sensing devices 50R and 50G.

Figure 4:
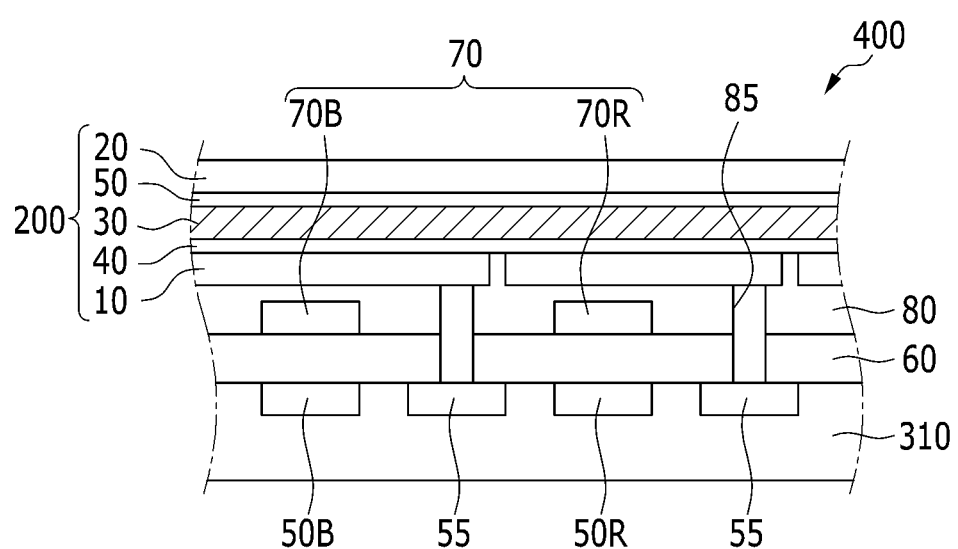
FIG. 4 is a cross-sectional view showing an organic CMOS image sensor according to at least one example embodiment.

FIG. 4 is a cross-sectional view showing an organic CMOS image sensor according to another example embodiment.

Referring to FIG. 4, the organic CMOS image sensor 400 according to an example embodiment includes a semiconductor substrate 310 integrated with photo-sensing devices 50B and 50R, a transmission transistor (not shown), and a charge storage 55, a lower insulation layer 60, color filters 70B and 70R, an upper insulation layer 80, and an organic photoelectric device 200.

The organic CMOS image sensor 200 further includes auxiliary charge layers 40 and 50. The auxiliary charge layers 40 and 50 are the same as above, and either one of the auxiliary charge layers 40 and 50 may be omitted.

The image sensor may be applied to various electronic devices, for example a mobile phone, a digital camera, and the like, but is not limited thereto.

Hereinafter, the present disclosure is illustrated in more detail with reference to examples. However, these examples are example, and the present disclosure is not limited thereto.

Example 1

An anode about 100 nm-thick is formed on a glass substrate by sputtering ITO, and an auxiliary charge layer is formed by laminating a 10 nm-thick molybdenum oxide (MoOx, 0<x≤3) thin film thereon. Subsequently, on the molybdenum oxide (MoOx) thin film, a compound represented by the following Chemical Formula 1a (a p-type semiconductor compound) and C60 (an n-type semiconductor compound) are codeposited in a volume ratio of 1:1, forming an 85 nm-thick photoelectric conversion layer. On the photoelectric conversion layer, an 80 nm-thick cathode is formed by sputtering aluminum (Al), manufacturing an organic photoelectric device.

[Chemical Formula 1a]

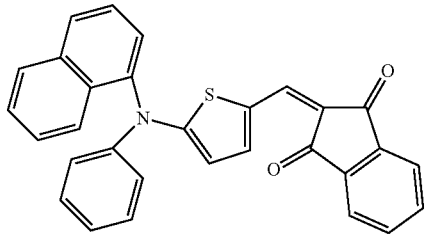

Example 2

An organic photoelectric device is manufactured according to the same method as Example 1, except for using a compound represented by the following Chemical Formula 1b as a p-type semiconductor compound.

[Chemical Formula 1b]

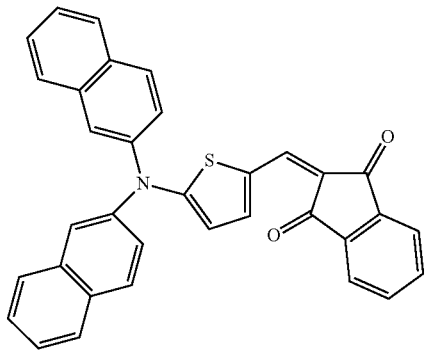

Example 3

An organic photoelectric device is manufactured according to the same method as Example 1, except for using a compound represented by the following Chemical Formula 1c as a p-type semiconductor compound.

[Chemical Formula 1c]

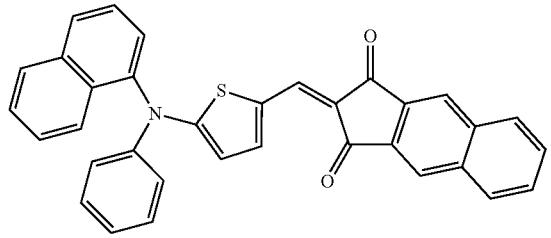

Example 4

20.0 g of boron sub-phthalocyanine chloride (Sigma-Aldrich Co., Ltd.), 32.0 g of triphenyl silanol (Dong Kyung Co., Ltd.), and 14.8 g of silver trifluoromethane sulfonate (Dong Kyung Co., Ltd.) are heated and refluxed in 150 ml of dry toluene for 15 hours. Then, 200 ml of methylene chloride is added thereto, the mixture is filtered, and the filtered solution is concentrated under a reduced pressure and purified through silica gel column chromatography, obtaining a compound represented by the following Chemical Formula 2a.

Then, an organic photoelectric device is manufactured according to the same method as Example 1, except for codepositing the compound represented by the following Chemical Formula 2a (a p-type semiconductor compound) and C60 (an n-type semiconductor compound) in a volume ratio of 1:2 to form a photoelectric conversion layer.

[Chemical Formula 2a]

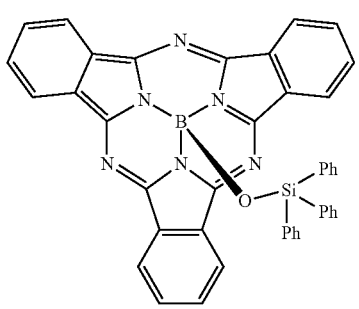

Example 5

A compound represented by the following Chemical Formula 2b is prepared according to a method described in Angewandte Chemie, International Edition Volume 50, Issue 15, pages 3506-3509.

Then, an organic photoelectric device is manufactured according to the same method as Example 1, except for codepositing the compound represented by the following Chemical Formula 2b (a p-type semiconductor compound) and C60 (an n-type semiconductor compound) in a volume ratio of 1:2 to form a photoelectric conversion layer.

[Chemical Formula 2b]

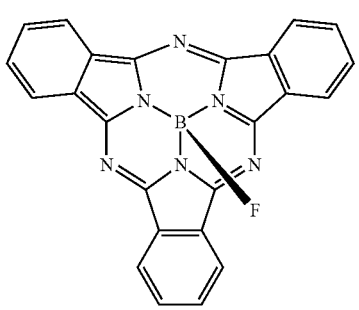

Comparative Example 1

An organic photoelectric device is manufactured according to the same method as Example 1, except for codepositing the compound represented by the above Chemical Formula 1a (a p-type semiconductor compound) and C60 (an n-type semiconductor compound) in a volume ratio of 2:1 to form an 85 nm-thick photoelectric conversion layer.

Comparative Example 2

An organic photoelectric device is manufactured according to the same method as Example 1, except for codepositing the compound represented by the above Chemical Formula 1b (a p-type semiconductor compound) and C60 (an n-type semiconductor compound) in a volume ratio of 2:1 to form an 85 nm-thick photoelectric conversion layer.

Comparative Example 3

An organic photoelectric device is manufactured according to the same method as Example 1, except for codepositing the compound represented by the above Chemical Formula 1c (a p-type semiconductor compound) and C60 (an n-type semiconductor compound) in a volume ratio of 2:1 to form an 85 nm-thick photoelectric conversion layer.

Comparative Example 4

An organic photoelectric device is manufactured according to the same method as Example 1, except for codepositing the compound represented by the above Chemical Formula 2a (a p-type semiconductor compound) and C60 (an n-type semiconductor compound) in a volume ratio of 2:1 to form an 85 nm-thick photoelectric conversion layer.

Comparative Example 5

An organic photoelectric device is manufactured according to the same method as Example 1, except for codepositing the compound represented by the above Chemical Formula 2b (a p-type semiconductor compound) and C60 (an n-type semiconductor compound) in a volume ratio of 2:1 to form an 85 nm-thick photoelectric conversion layer.

External Quantum Efficiency (EQE)

External quantum efficiency (EQE) of each organic photoelectric device according to Examples 1 to 5 and Comparative Examples 1 to 5 depending on a wavelength and a voltage is evaluated.

The external quantum efficiency is measured by using an IPCE measurement system (McScience Co., Ltd., Korea). First of all, the IPCE measurement system is calibrated by using a Si photodiode (Hamamatsu Photonics K.K., Japan) and respectively mounted on the organic photoelectric devices according to Examples 1 to 5 and Comparative Examples 1 to 5, and their external quantum efficiency at a wavelength ranging from about 300 nm to about 750 nm is measured.

Figure 5:
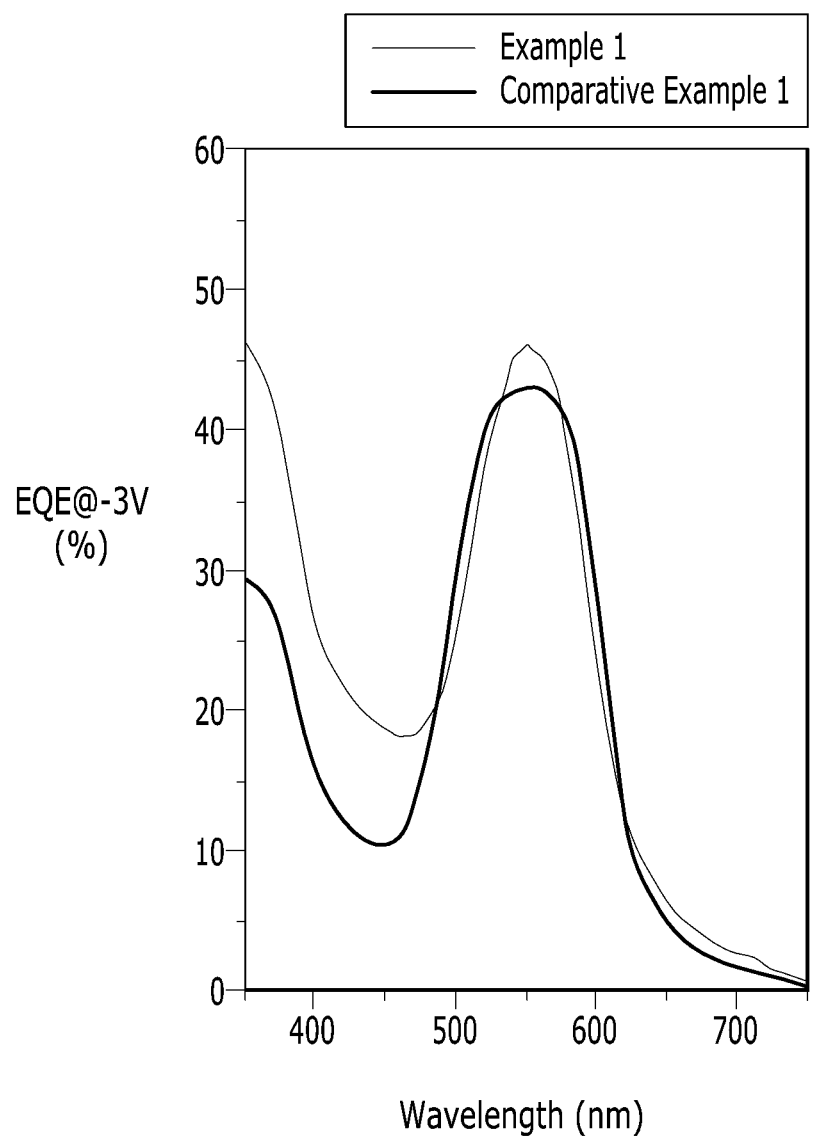
FIG. 5 is a graph showing an absorption curved line at a 3 V applied voltage of the organic photoelectric devices according to Example 1 and Comparative Example 1.
Figure 6:
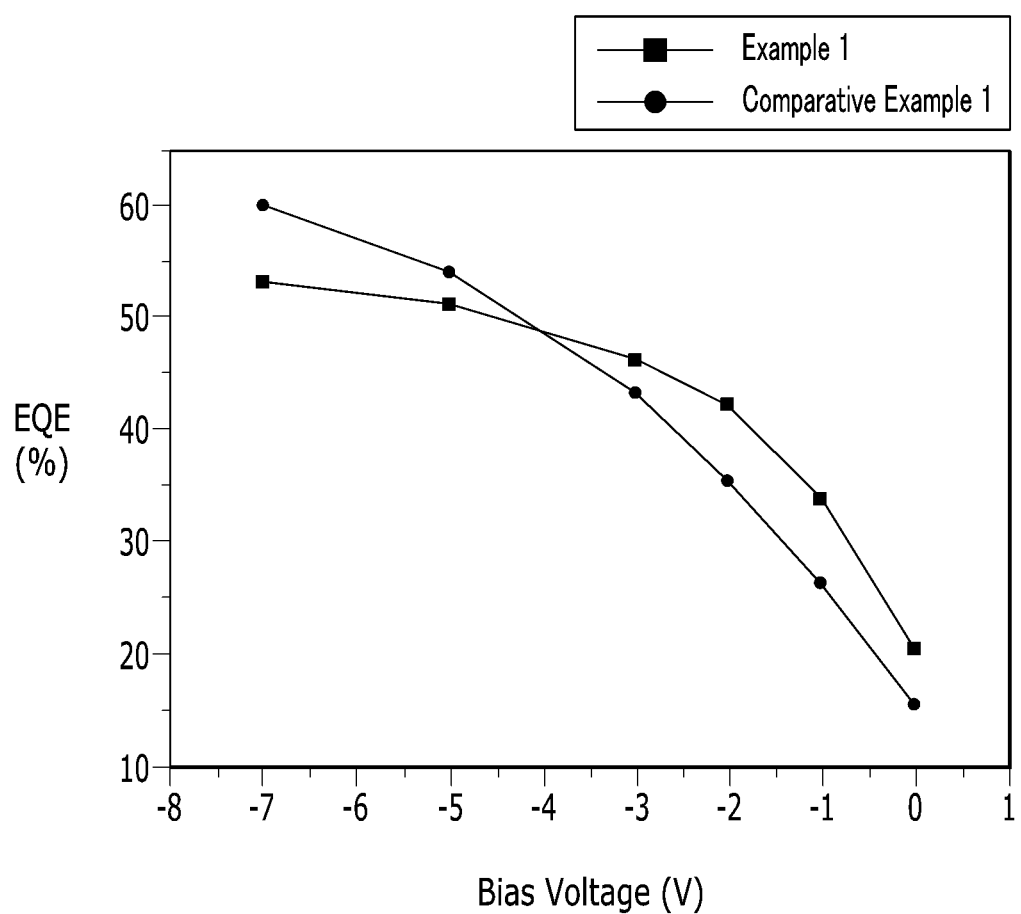
FIG. 6 is a graph showing external quantum efficiency depending on a voltage of the organic photoelectric devices according to Example 1 and Comparative Example 1.
Figure 7:
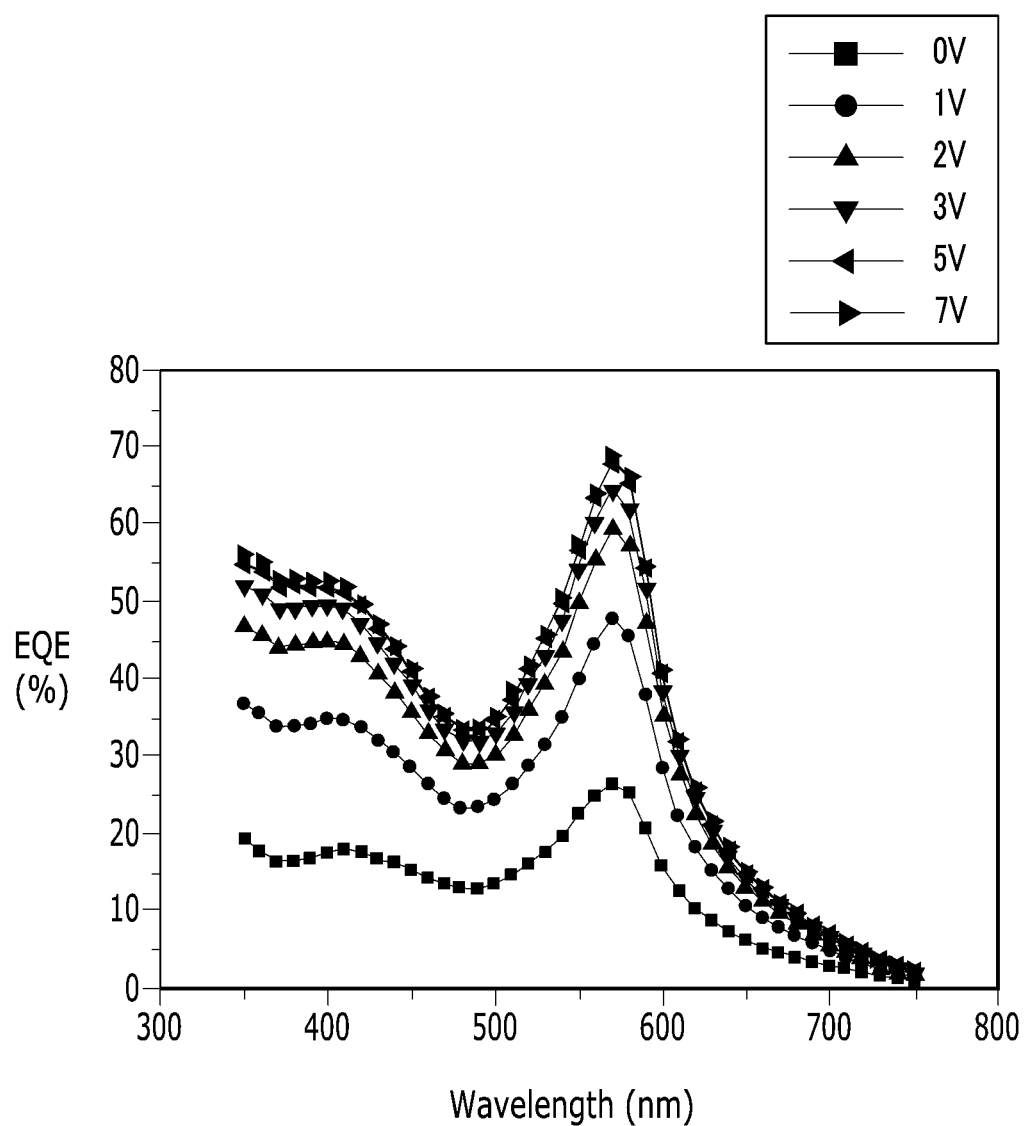
FIG. 7 is a graph showing absorption curves depending on an applied voltage of the organic photoelectric device according to Example 4.
Figure 8:
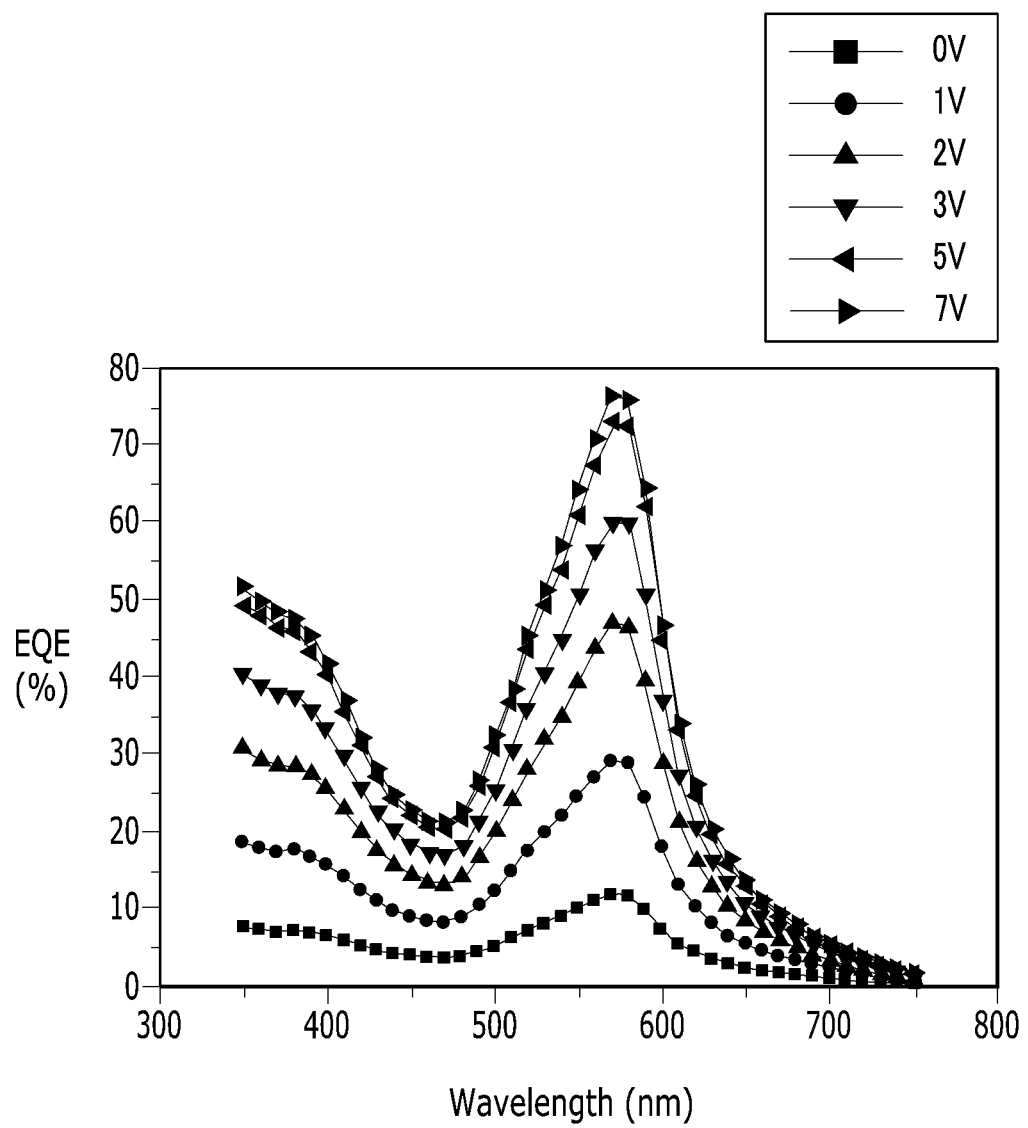
FIG. 8 is a graph showing absorption curves depending on an applied voltage of the organic photoelectric device according to Comparative Example 4.
Figure 9:
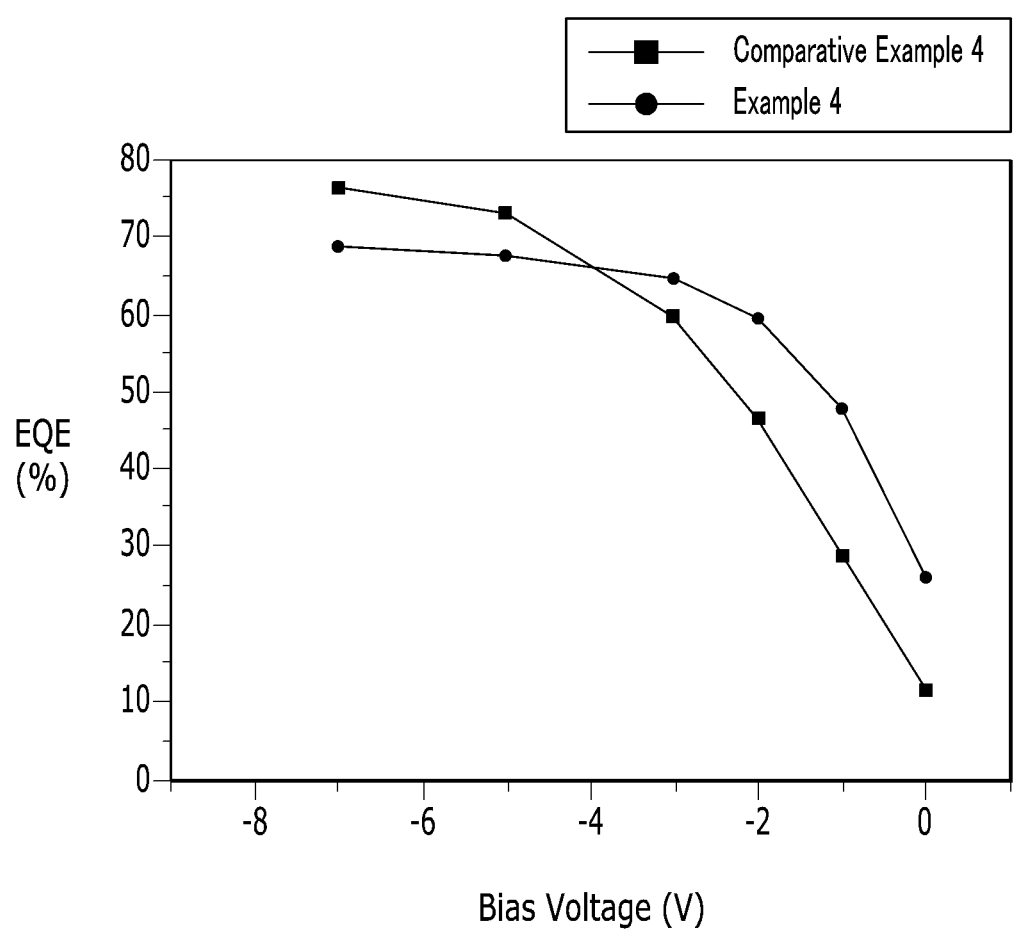
FIG. 9 is a graph showing external quantum efficiency depending on a voltage of the organic photoelectric devices according to Example 4 and Comparative Example 4.
Figure 10:
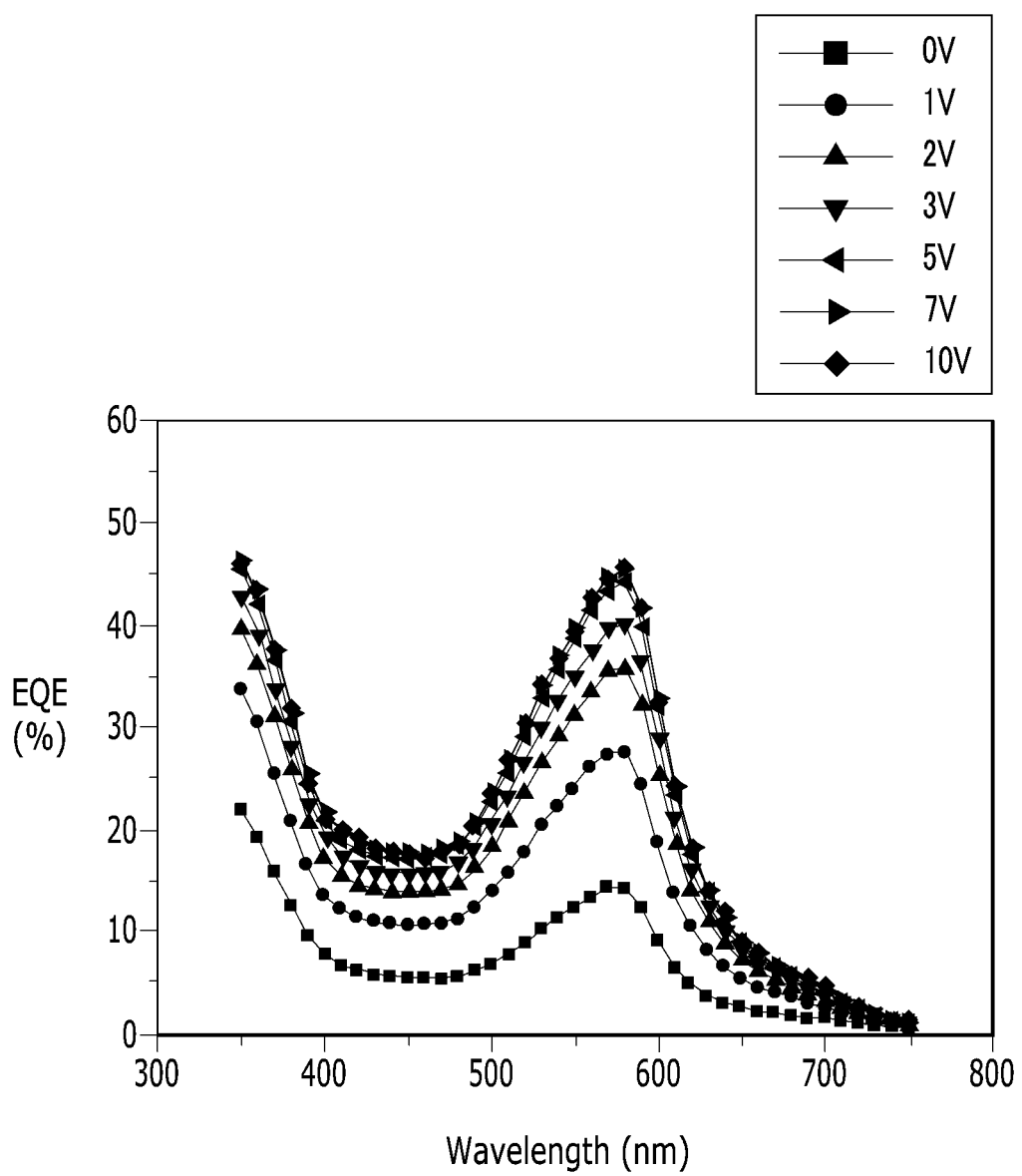
FIG. 10 is a graph showing absorption curves depending on an applied voltage of the organic photoelectric device according to Example 5.
Figure 11:
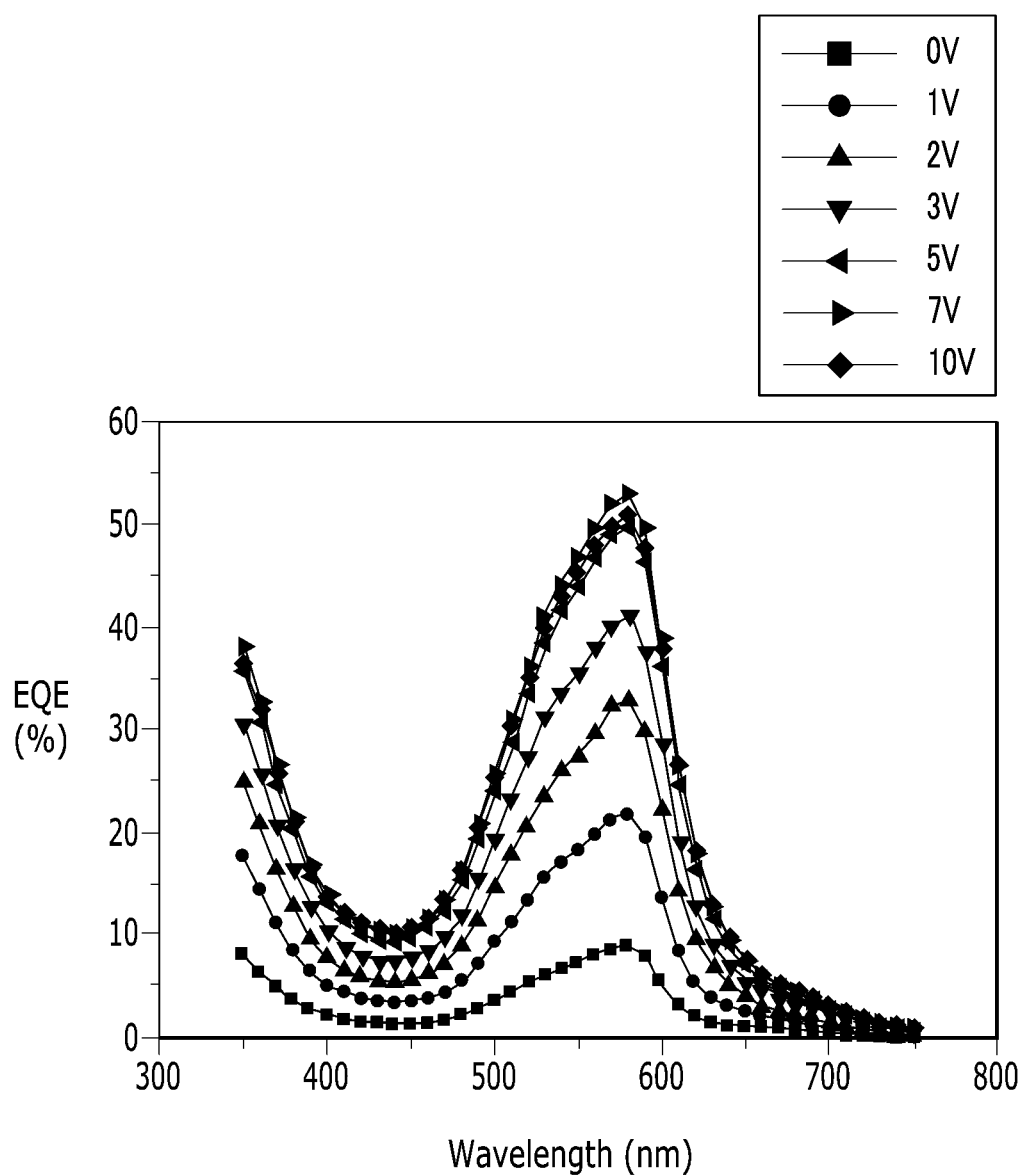
FIG. 11 is a graph showing absorption curves depending on an applied voltage of the organic photoelectric device according to Comparative Example 5.

FIG. 5 is a graph showing absorption curves at a voltage of 3 V applied to the organic photoelectric devices according to Example 1 and Comparative Example 1, and FIG. 6 is a graph showing external quantum efficiency depending on the voltage of the organic photoelectric device according to Example 1 and Comparative Example 1. FIG. 7 is a graph showing absorption curves depending on an applied voltage of the organic photoelectric device according to Example 4, FIG. 8 is a graph showing absorption curves depending on an applied voltage of the organic photoelectric device according to Comparative Example 4, and FIG. 9 is a graph showing external quantum efficiency depending on a voltage of the organic photoelectric devices according to Example 4 and Comparative Example 4. FIG. 10 is a graph showing absorption curves depending on an applied voltage of the organic photoelectric device according to Example 5, FIG. 11 is a graph showing absorption curves depending on an applied voltage of the organic photoelectric device according to Comparative Example 5, and FIG. 12 is a graph showing external quantum efficiency depending on a voltage of the organic photoelectric devices according to Example 5 and Comparative Example 5.

Referring to FIGS. 5, 7, 8, 10, and 11, the organic photoelectric devices according to Examples 1, 4, and 5 show a greatly improved external quantum efficiency (EQE) in a green wavelength region of about 500 nm to 600 nm, which is higher than the external quantum efficiency (EQE) of the organic photoelectric devices according to Comparative Examples 1, 4, and 5.

Figure 12:
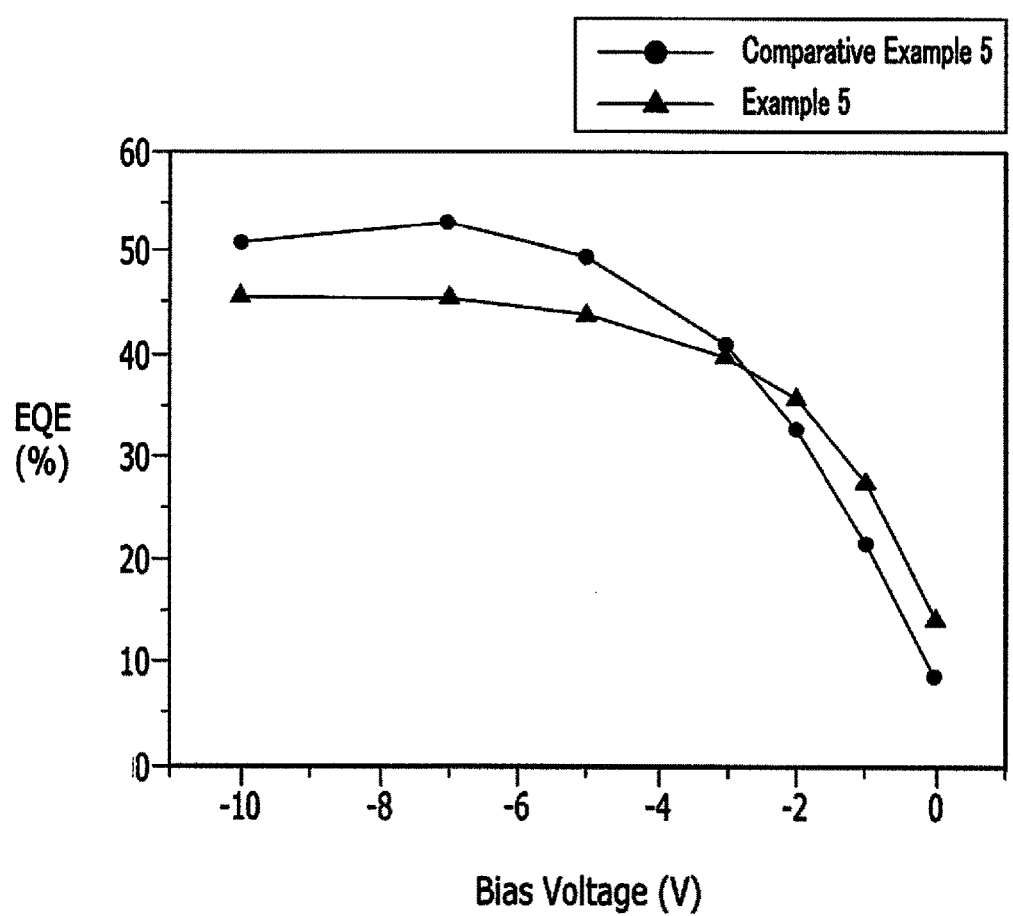
FIG. 12 is a graph showing external quantum efficiency depending on a voltage of the organic photoelectric devices according to Example 5 and Comparative Example 5.

In addition, referring to FIGS. 6, 9, and 12, the organic photoelectric device of Examples 1, 4, and 5 show a difference between external quantum efficiency at −2 V and external quantum efficiency at −3 V of less than or equal to 10%, and particularly, an external quantum efficiency difference of 8.7%, 7.8%, and 10%, respectively, and external quantum efficiency of greater than or equal to 40% at a desired, or alternatively predetermined driving voltage (−3 V). On the other hand, the organic photoelectric devices according to Comparative Examples 1, 4, and 5 show a difference between external quantum efficiency at −2 V and external quantum efficiency at −3 V of greater than 10%.

While this disclosure has been described in connection with what is presently considered to be practical example embodiments, it is to be understood that the example embodiments are not limited to the disclosed example embodiments, but, on the contrary, is intended to cover various modifications and equivalent arrangements included within the spirit and scope of the appended claims.

What is claimed is:

1. An organic photoelectric device, comprising:
a first electrode and a second electrode facing each other, and a photoelectric conversion layer, between the first electrode and the second electrode,
wherein the photoelectric conversion layer includes a p-type semiconductor compound and an n-type semiconductor compound,
the organic photoelectric device satisfies the following Equation 1 and has an external quantum efficiency (EQE) that is greater than or equal to about 40% at −3 V,
the p-type semiconductor compound includes an indandione-based compound and the n-type semiconductor compound includes fullerene or a fullerene derivative, and
when the volumes of the p-type semiconductor compound and the n-type semiconductor compound are referred to as p and n, respectively, n/p is in a range of about 0.5<n/p≤about2:

$$\frac{|(EQE \text{ at } -3V)(EQE \text{ at } -2V)|}{EQE \text{ at } -3V} \leq 0.1. \quad \text{[Equation 1]}$$

2. An organic photoelectric device, comprising:
a first electrode and a second electrode facing each other, and a photoelectric conversion layer, between the first electrode and the second electrode,
wherein the photoelectric conversion layer includes a p-type semiconductor compound and an n-type semiconductor compound,
the organic photoelectric device satisfies the following Equation 1 and has an external quantum efficiency (EQE) that is greater than or equal to about 40% at −3 V, the indandione-based compound is represented by the following Chemical Formula 1:

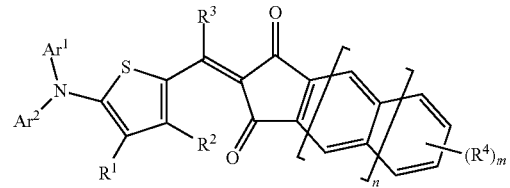

[Chemical Formula 1]

wherein, in Chemical Formula 1,
Ar$^1$ and Ar$^2$ are independently a phenyl group or a naphthyl group, provided that at least one of Ar$^1$ and Ar$^2$ is a naphthyl group,
R$^1$ to R$^4$ are independently hydrogen, a C1 to C6 alkyl group, a C1 to C6 haloalkyl group, a halogen, or CN,
n is 0 or 1,
m is an integer ranging from 1 to 3.

3. The organic photoelectric device of claim 1, wherein the p-type semiconductor compound is represented by the following Chemical Formula 1-1:

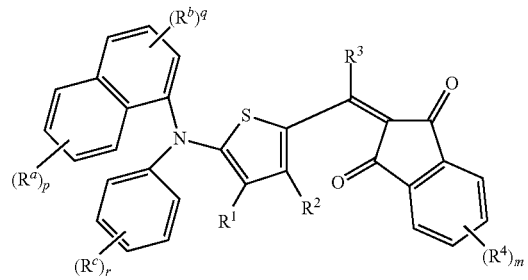

[Chemical Formula 1-1]

wherein, in Chemical Formula 1-1,
R$^1$ to R$^4$ are independently hydrogen, a C1 to C6 alkyl group, a C1 to C6 haloalkyl group, a halogen, or CN,
R$^a$ to R$^c$ are independently hydrogen, a C1 to C6 alkyl group, a C1 to C6 haloalkyl group, a halogen, or CN,
p, q, and r are integers ranging from 1 to 3, and
m is an integer ranging from 1 to 3.

4. The organic photoelectric device of claim 1, wherein the p-type semiconductor compound is represented by the following Chemical Formula 1-2:

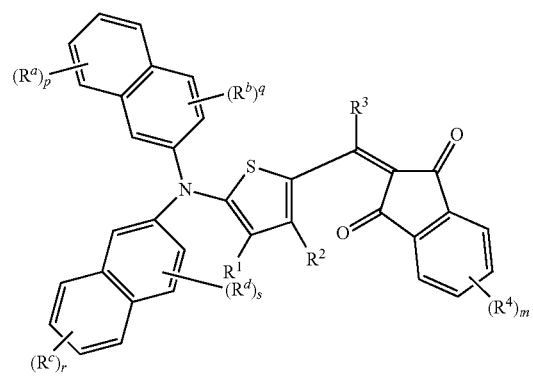

[Chemical Formula 1-2]

wherein, in Chemical Formula 1-2,
R$^1$ to R$^4$ are independently hydrogen, a C1 to C6 alkyl group, a C1 to C6 haloalkyl group, a halogen, or CN,
R$^a$ to R$^d$ are independently hydrogen, a C1 to C6 alkyl group, a C1 to C6 haloalkyl group, a halogen, or CN, p, q, r, and s are integers ranging from 1 to 3, and
m is an integer ranging from 1 to 3.

5. The organic photoelectric device of claim 1, wherein the p-type semiconductor compound is represented by the following Chemical Formula 1-3:

[Chemical Formula 1-3]

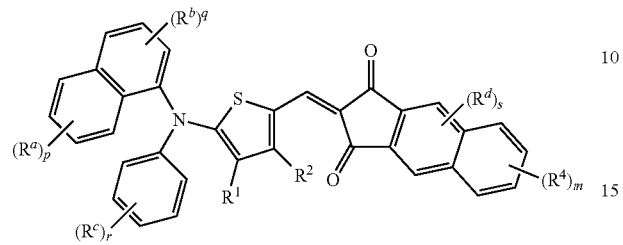

wherein, in Chemical Formula 1-3,
$R^1$ to $R^4$ are independently hydrogen, a C1 to C6 alkyl group, a C1 to C6 haloalkyl group, a halogen, or CN,
$R^a$ to $R^c$ are independently hydrogen, a C1 to C6 alkyl group, a C1 to C6 haloalkyl group, a halogen, or CN,
p, q, and r are integers ranging from 1 to 3, and
m is an integer ranging from 1 to 3.

6. The organic photoelectric device of claim 1, wherein a light absorption curve of the p-type semiconductor compound has a full width at half maximum (FWHM) of about 50 nm to about 110 nm in a thin film state.

7. The organic photoelectric device of claim 1, wherein the p-type semiconductor compound has a maximum absorption wavelength ($\lambda_{max}$) between about 500 nm and about 600 nm.

8. The organic photoelectric device of claim 1, wherein the fullerene or the fullerene derivative is one of C60, a C60 derivative, C70, a C70 derivative, and a combination thereof.

9. The organic photoelectric device of claim 1, wherein when the volumes of the p-type semiconductor compound and the n-type semiconductor compound are referred to as p and n, respectively, n/p is in a range of about $0.7 \leq n/p \leq 5$ about 1.8.

10. The organic photoelectric device of claim 1, wherein the p-type semiconductor compound comprises a metal-free phthalocyanine, and the n-type semiconductor compound comprises fullerene or a fullerene derivative.

11. The organic photoelectric device of claim 10, wherein the metal-free phthalocyanine is represented by the following Chemical Formula 2:

[Chemical Formula 2]

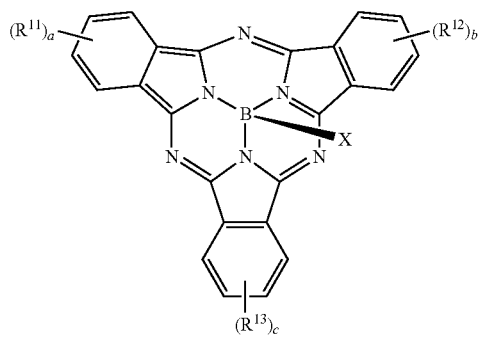

wherein, in Chemical Formula 2,
$R^{11}$ to $R^{13}$ are independently hydrogen, a substituted or unsubstituted C1 to C30 aliphatic hydrocarbon group, a substituted or unsubstituted C6 to C30 aromatic hydrocarbon group, a substituted or unsubstituted C1 to C30 aliphatic heterocyclic group, a substituted or unsubstituted C2 to C30 aromatic heterocyclic group, a substituted or unsubstituted C1 to C30 alkoxy group, a substituted or unsubstituted C1 to C30 aryloxy group, a thio group, an arylthio group, an arylthio group, a cyano group, a cyano-containing group, a halogen, a halogen-containing group, a substituted or unsubstituted sulfonyl group, a substituted or unsubstituted aminosulfonyl group, a substituted or unsubstituted arylsulfonyl group, or a combination thereof,
a, b, and c are integers ranging from 1 to 3,
X is —F, —$OR^{22}$, —$N(R^{23})(R^{24})$, or —$OSi(R^{25})(R^{26})(R^{27})$,
$R^{22}$ is a substituted or unsubstituted C6 to C30 aryl group, a substituted or unsubstituted C3 to C30 heteroaryl group, a substituted or unsubstituted silyl group, or a combination thereof,
$R^{23}$ and $R^{24}$ are independently a substituted or unsubstituted C6 to C30 aryl group, a substituted or unsubstituted C3 to C30 heteroaryl group, a substituted or unsubstituted silyl group, or a combination thereof, and
$R^{25}$, $R^{26}$, and $R^{27}$ are independently a substituted or unsubstituted C1 to C30 alkyl group, a substituted or unsubstituted C6 to C30 aryl group, a substituted or unsubstituted C3 to C30 heterocyclic group, a substituted or unsubstituted C1 to C30 alkoxy group, a substituted or unsubstituted amine group, a substituted or unsubstituted C6 to C30 arylamine group, a substituted or unsubstituted silyl group, or a combination thereof.

12. The organic photoelectric device of claim 10, wherein the fullerene or the fullerene derivative is one of C60, a C60 derivative, C70, a C70 derivative, and a combination thereof.

13. The organic photoelectric device of claim 10, wherein when the volumes of the p-type semiconductor compound and the n-type semiconductor compound are referred to as p and n, respectively, n/p is in a range of about $1 < n/p \leq$ about 3.

14. The organic photoelectric device of claim 1, wherein the photoelectric conversion layer comprises an intrinsic layer including the p-type semiconductor compound and the n-type semiconductor compound.

15. The organic photoelectric device of claim 1, wherein the photoelectric conversion layer further comprises at least one of a p-type layer on one side of the intrinsic layer and an n-type layer positioned on the other side of the intrinsic layer.

16. An image sensor comprising the organic photoelectric device of claim 1.

17. The image sensor of claim 16, further comprising:
a semiconductor substrate integrated with one or more first photo-sensing devices configured to sense light in a blue wavelength region and one or more second photo-sensing devices configured to sense light in a red wavelength region,
a color filter layer on the semiconductor substrate and including a blue filter configured to selectively absorb light in a blue wavelength region and a red filter configured to selectively absorb light in a red wavelength region, and
the organic photoelectric device on the color filter layer and configured to selectively absorb light in a green wavelength region.

18. An electronic device comprising the image sensor of claim 16.

* * * * *